United States Patent
Chao et al.

(10) Patent No.: US 7,041,534 B2
(45) Date of Patent: May 9, 2006

(54) SEMICONDUCTOR CHIP PACKAGE AND METHOD FOR MAKING THE SAME

(75) Inventors: Shin Hua Chao, Kaohsiung (TW); Jen Kuang Fang, Pingtung County (TW); Ho Ming Tong, Taipei (TW)

(73) Assignee: Advanced Semiconductor Engineering, Inc., Ksohsiung (TW)

( * ) Notice: Subject to any disclaimer, the term of this patent is extended or adjusted under 35 U.S.C. 154(b) by 0 days.

(21) Appl. No.: 10/926,334

(22) Filed: Aug. 26, 2004

(65) Prior Publication Data

US 2005/0087859 A1    Apr. 28, 2005

(30) Foreign Application Priority Data

Aug. 28, 2003   (TW) .............................. 92123767 A

(51) Int. Cl.
*H01L 21/44* (2006.01)
*H01L 21/4763* (2006.01)

(52) U.S. Cl. ...................... 438/114; 438/622; 438/624
(58) Field of Classification Search ............... 438/114, 438/622, 624

See application file for complete search history.

(56) References Cited

U.S. PATENT DOCUMENTS

| | | | | |
|---|---|---|---|---|
| 5,434,751 A | * | 7/1995 | Cole et al. | 361/792 |
| 5,834,844 A | * | 11/1998 | Akagawa et al. | 257/734 |
| 5,841,193 A | * | 11/1998 | Eichelberger | 257/723 |
| 6,153,448 A | * | 11/2000 | Takahashi et al. | 438/114 |
| 6,235,552 B1 | * | 5/2001 | Kwon et al. | 438/106 |
| 6,281,046 B1 | * | 8/2001 | Lam | 438/113 |
| 6,426,545 B1 | * | 7/2002 | Eichelberger et al. | 257/633 |

* cited by examiner

*Primary Examiner*—Matthew Smith
*Assistant Examiner*—Lex H. Malsawma

(57) ABSTRACT

A semiconductor chip package mainly includes a semiconductor chip, a first dielectric layer disposed on the semiconductor chip, a plurality of conductive traces electrically connected to the semiconductor chip, a second dielectric layer disposed on the conductive traces and the first dielectric layer wherein a portion of the conductive traces are exposed from the second dielectric layer, and a plurality of contacts for external connection formed on the exposed portion of the conductive traces. The semiconductor chip has a surface including an active area, a dummy area surrounding the active area, and a plurality of bonding pads disposed on the active area. The bonding pads are electrically connected to the contacts by the conductive traces. The present invention further provides methods for manufacturing the semiconductor chip package.

10 Claims, 8 Drawing Sheets

SEMICONDUCTOR CHIP PACKAGE AND METHOD FOR MAKING THE SAME

This application claims the priority benefit of Taiwan Patent Application Serial Number 092123767, filed Aug. 28, 2003, the full disclosure of which is incorporated herein by reference.

BACKGROUND OF THE INVENTION

1. Field of the Invention

This invention relates to a semiconductor chip package.

2. Description of the Related Art

Higher performance, lower cost, increased miniaturization of integrated circuit components, and greater packaging density of integrated circuits are ongoing goals of the computer industry. As these goals are achieved, microelectronic chips become smaller. Of course, the goal of greater packaging density requires that the entire microelectronic chip package be equal to or only slightly larger (about 10% to 30%) than the size of the microelectronic chip itself. Such microelectronic chip package is called a "chip scale package (CSP)".

As shown in FIG. 1, a conventional chip scale package comprises a microelectronic chip 102 and a build-up structure directly formed on the active surface 104 of the microelectronic chip 102. The build-up structure may include a dielectric layer 106 disposed on the active surface 104 of the microelectronic chip. Conductive traces 108 may be formed on the dielectric layer 106, wherein a portion of each conductive trace 108 contacts at least one contact pad 112 on the active surface 104 of the microelectronic chip. External contacts, such as solder balls or conductive pins for contact with an external component (not shown), may be fabricated to electrically contact at least one conductive trace 108. FIG. 1 illustrates the external contacts as solder balls 114 where are surrounded by a solder mask material 116 on the dielectric layer 106. However, in such kind of chip scale package, the surface area provided by the active surface 104 of the microelectronic chip generally does not provide enough surface for all of the external contacts needed to contact the external component.

SUMMARY OF THE INVENTION

Therefore, it is a primary object of the present invention to provide a semiconductor chip package which overcomes, or at least reduces the above-mentioned problems of the prior art.

The semiconductor chip package according to the present invention mainly comprises a semiconductor chip, a first dielectric layer disposed on the semiconductor chip, a plurality of conductive traces electrically connected to the semiconductor chip, a second dielectric layer disposed on the conductive traces and the first dielectric layer wherein a portion of each conductive trace is exposed from the second dielectric layer, and a plurality of external contacts formed on the exposed portions of the conductive traces. Note that the semiconductor chip has a surface including an active area, a dummy area surrounding the active area, and a plurality of bonding pads disposed on the active area. The bonding pads are electrically connected to the external contacts by the conductive traces, respectively.

According to one embodiment of the present invention, the semiconductor chip package may further comprise a patterned conductive metal layer provided between the first dielectric layer and the semiconductor chip, and an adhesive layer provided between the patterned conductive metal layer and the semiconductor chip. The patterned conductive metal layer may function as a ground plane for supplying the ground potential or a power plane for supplying the source voltage.

The semiconductor chip packages disclosed in the present invention are characterized in that the external contacts may be positioned over the active area and the dummy area thereby the semiconductor chip package may be designed to have a "fan-out" or "fan-in" layout to provide enough surface for the external contacts. Furthermore, since the dummy area is a portion of the chip and is formed from semiconductor material with good heat dissipation capability, the dummy area may function as a heat sink to help heat dissipation of the chip thereby enhancing the thermal performance of the semiconductor chip package. According to the aforementioned advantages, the semiconductor chip package of the present invention provides a larger distributing surface for the external contacts and has a better thermal performance, and, therefore, is a suitable design for high packaging density (high pin count) semiconductor chip packages.

The present invention provides a method for manufacturing wafer level semiconductor chip packages via build-up process. First, a first dielectric layer is formed on an upper surface of a semiconductor wafer comprising a plurality of semiconductor chips each having a plurality of bonding pads disposed on the upper surface of the semiconductor wafer. A plurality of first openings are formed in the first dielectric layer to expose the bonding pads of the semiconductor chips from the first dielectric layer, and a conductive metal layer is formed on the first dielectric layer and the bonding pads exposed in the first openings by plating or depositing (e.g., CVD or PVD). The conductive metal layer is selectively etched to form a plurality of conductive traces on the first dielectric layer and the bonding pads exposed in the first openings. Then, a second dielectric layer is formed on the first dielectric layer and the conductive traces. A plurality of second openings are formed in the second dielectric layer to expose a portion of each of the conductive traces from the second dielectric layer. Thereafter, a plurality of external contacts are formed on the exposed portions of the conductive traces. Finally, the semiconductor wafer is cut to separate the semiconductor chips from each other thereby obtaining the semiconductor chip packages.

Although only one layer of conductive traces between two dielectric layers is formed by the aforementioned method, the build-up process may be utilized to form multilayer conductive traces with each layer sandwiched between two dielectric layers thereby obtaining a high packaging density semiconductor chip package.

The method according to another embodiment of the present invention comprises the following steps. First, a first dielectric layer is formed on an upper surface of a semiconductor wafer comprising a plurality of semiconductor chips each having a first bonding pad (e.g., a power pad or a ground pad) and a plurality of second bonding pads (e.g., signal pads) disposed on the upper surface of the semiconductor wafer. A first opening is formed in the first dielectric layer to expose the first bonding pad of each semiconductor chip from the first dielectric layer, and a first conductive metal layer is formed on the first dielectric layer and the first bonding pads exposed in the first openings by plating or depositing (e.g., CVD or PVD). The first conductive metal layer is selectively etched to form a plurality of second openings at locations corresponding to the second bonding pads. Then, a second dielectric layer is formed on the first conductive metal layer and the second openings. A plurality of third openings are formed in the first dielectric layer and the second dielectric layer to expose the second bonding pads of the semiconductor chips from the first dielectric layer and the second dielectric layer wherein the third openings are smaller than the second openings such that the first conductive metal layer is not exposed in the third openings. A fourth opening is formed in the second dielectric layer to expose a portion of the first conductive metal layer from the second dielectric layer. A second conductive metal layer is formed on the second dielectric layer, the second bonding pads exposed in the third openings and the first conductive metal layer exposed in the fourth opening by plating or depositing (e.g., CVD or PVD). The second conductive metal layer is selectively etched to form a plurality of conductive traces extending on the second dielectric layer and the second bonding pads exposed in the third openings or extending on the second dielectric layer and the first conductive metal layer exposed in the fourth opening. A third dielectric layer is formed on the second dielectric layer and the conductive traces. A plurality of fifth openings are formed in the third dielectric layer to expose a portion of each of the conductive traces from the third dielectric layer. A plurality of external contacts are formed on the exposed portions of the conductive traces. Finally, the semiconductor wafer is cut to separate the semiconductor chips from each other thereby obtaining the semiconductor chip packages. In this embodiment, when the first bonding pad is a ground pad, the conductive metal layer functions as a ground plane for supplying the ground potential; and, when the first bonding pad is a power pad, the conductive metal layer functions as a power plane for supplying the source voltage. In the aforementioned methods, the conductive metal layer forming step may comprise the steps of electroless plating a metal seed layer, and then thickening the seed layer to a predetermined thickness by electroplating.

The present invention further provides a method for manufacturing wafer level semiconductor chip packages via lamination process. First, a substrate is laminated on an upper surface of a semiconductor wafer, wherein the substrate includes a dielectric layer and a first conductive metal layer laminated on an upper surface of the dielectric layer. A plurality of first openings are formed in the substrate at locations facing the first bonding pads of the semiconductor chips to expose the first bonding pads from the substrate by laser drilling or mechanical drilling. After the first conductive metal layer is electrically connected to the first bonding pads exposed in the first openings, the first conductive metal layer is selectively etched to form a plurality of conductive traces electrically connected to the first bonding pads. Then, a patterned solder mask is formed on the dielectric layer and the conductive traces such that a portion of each of the conductive traces is exposed from the patterned solder mask. After a plurality of external contacts are formed on the exposed portions of the conductive traces, the semiconductor wafer is cut to separate the semiconductor chips from each other thereby obtaining the semiconductor chip packages. In this method, the dielectric layer of the substrate may be formed from a prepreg; hence, the substrate may be directly secured to the semiconductor wafer by thermocompression.

Furthermore, the substrate may further comprise a second conductive metal layer laminated on an lower surface of the dielectric layer and each of the semiconductor chips may further comprise a second bonding pad, wherein the second conductive metal layer of the substrate has a plurality of second openings formed at locations corresponding to the first bonding pads wherein the second opening is larger than the first opening such that the second conductive metal layer is not exposed in the first opening. In this embodiment, the substrate is secured to the semiconductor wafer via an adhesive layer, and it is necessary to form a third opening positioned over the second bonding pad such that the second bonding pad and a portion of the second conductive metal layer are exposed in the third opening during. During the step of electrically connecting the first conductive metal layer and the first bonding pads exposed in the first openings the second bonding pads, the second bonding pads are also electrically connected to the first conductive metal layer and the second conductive metal layer. During the step of selectively etching the first conductive metal layer, a second conductive trace electrically connected to the second bonding pads is formed, too. During the patterned solder mask forming step, a portion of the second conductive trace is exposed from the patterned solder mask. During the external contacts forming step, an additional external contact is formed contacts on the exposed portion of the second conductive trace. In this embodiment, when the first bonding pad is a ground pad, the second conductive metal layer functions as a ground plane for supplying the ground potential; and, when the first bonding pad is a power pad, the conductive metal layer functions as a power plane for supplying the source voltage.

The semiconductor chip package manufacturing methods disclosed in the present invention are accomplished by directly forming a substrate structure for making external electrical connection on the surface of a semiconductor wafer via build-up or lamination process whereby a plurality of semiconductor chip packages are manufactured at one time thereby saving save labor hours and increasing throughput. As the cost of wafer is decreased and the size of wafer is increased, the methods of the present invention are suitable in packaging a semiconductor chip having the aforementioned active area and dummy area into a semiconductor chip package having a "fan-out" or "fan-in" layout by electrically connecting the bonding pads disposed on the active area to the external contacts positioned over the active area and the dummy area.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 5:
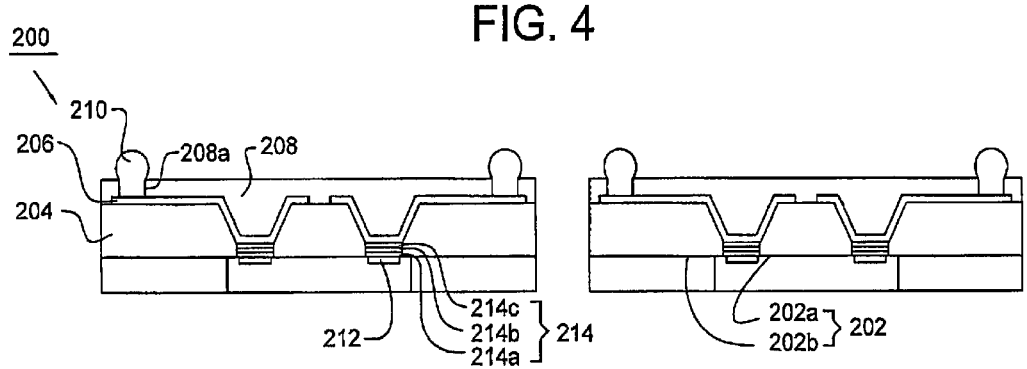

FIG. 5 shows semiconductor chip packages 200 according to one embodiment of the present invention. The semiconductor chip package 200 mainly comprises a semiconductor chip 202, a dielectric layer 204 disposed on the semiconductor chip 202, a plurality of conductive traces 206 electrically connected to the semiconductor chip 202, a dielectric layer 208 disposed on the conductive traces 206 and the dielectric layer 204 and a plurality of external contacts 210 formed on the conductive traces 206 exposed from the dielectric layer 208.

The semiconductor chip 202 has a surface including an active area 202a, a dummy area 202b surrounding the active area 202a. The upper surface of the semiconductor chip 202 is provided with a plurality of bonding pads 212, e.g., aluminum pads or copper pads, disposed on the active area 202a of the semiconductor chip 202. The bonding pads 212 are electrically connected to the internal integrated circuit of the chip. The bonding pads 212 are electrically connected to the external contacts 210 by the conductive traces 206, respectively. The external contacts 210 illustrated in FIG. 5 are only provided over the dummy area 202b. However, a person of skill in the art may understand that the external contacts 210 may be designed to be formed over the active area 202a and the dummy area 202b.

In order to ensures a good bondability between the bonding pads 212 and the conductive traces 206, the semiconductor chip package may further comprise an under bump metallurgy 214 provided between the bonding pad 212 and the conductive trace 206. If the bonding pad 212 of the semiconductor chip 202 is an aluminum contact pad and the conductive trace 206 is a copper trace, the under bump metallurgy may comprise an aluminum layer 214a on the bonding pad 212, a nickel-vanadium layer 214b on the aluminum layer 214a and a copper layer 214c on the nickel-vanadium layer 214b. If the bonding pad 212 of the semiconductor chip 202 is an aluminum contact pad and the conductive trace 206 is a titanium trace, the under bump metallurgy may comprise an titanium layer on the bonding pad 212, a nickel-vanadium layer on the titanium layer and a copper layer on the nickel-vanadium layer.

Figure 10:
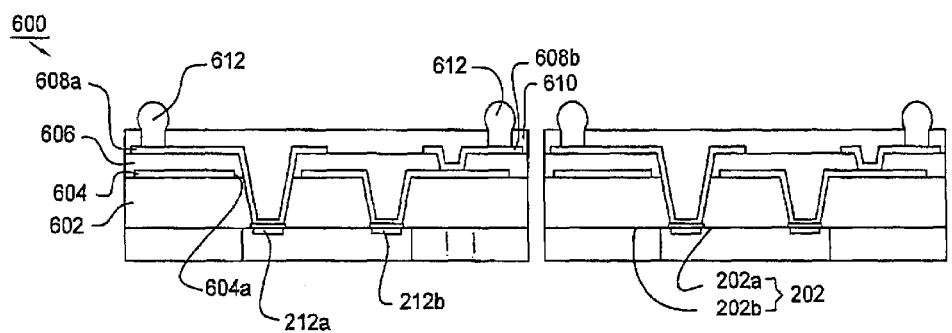

FIG. 10 shows semiconductor chip packages 600 according to another embodiment of the present invention. The semiconductor chip package 600 includes a semiconductor chip 202 having a plurality of bonding pads 212a for transmitting signal and at least one bonding pad 212b for ground or connecting to power. The semiconductor chip package 600 further includes at least two dielectric layers 602 and 606 formed on an upper surface of the semiconductor chip 202, a conductive metal layer 604 provided between the dielectric layers 602 and 606 and electrically connected to the bonding pad 212b, a plurality of conductive traces 608a electrically connected to the bonding pads 212a but not electrically connected to the conductive metal layer 604, a conductive trace 608b electrically connected to the conductive metal layer 604, a dielectric layer 610 formed on the dielectric layer 606, the conductive traces 608a and the conductive trace 608b, and a plurality of external contacts 612 respectively formed on the conductive traces 608a and 608b exposed from the dielectric layer 610. In this embodiment, when the bonding pad 212b is a ground pad, the conductive metal layer 604 functions as a ground plane for supplying the ground potential; and, when the bonding pad 212b is a power pad, the conductive metal layer 604 functions as a power plane for supplying the source voltage.

Figure 15:
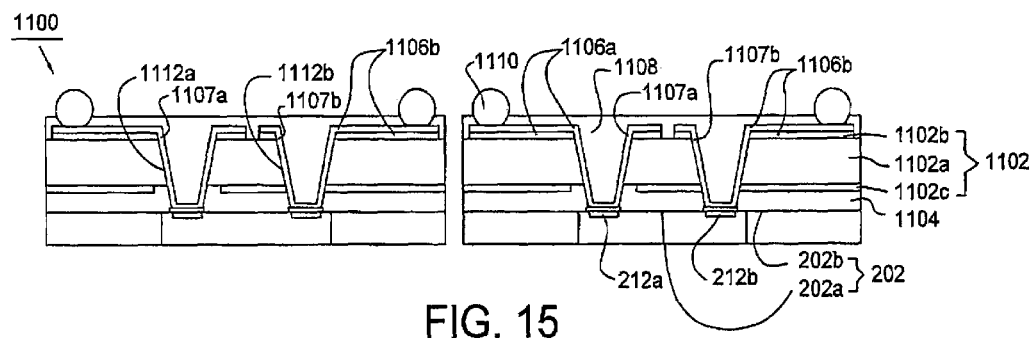

FIG. 15 shows semiconductor chip packages 1100 according to another embodiment of the present invention. The semiconductor chip package 1100 includes a substrate 1102 secured to the aforementioned semiconductor chip 202 via an adhesive layer 1104, a plurality of conductive traces 1106a electrically connected to the bonding pads 212a of the semiconductor chip 202, a conductive trace 1106b electrically connected to the bonding pad 212b of the semiconductor chip 202, a dielectric layer 1108 provided on the conductive traces 1106a and 1106b and the substrate 1102, and a plurality of external contacts 1110 formed on the conductive traces 1106a and 1106b exposed from the dielectric layer 1108.

The substrate 1102 includes a dielectric layer 1102a and two conductive metal layers 1102b and 1102c respectively laminated on upper and lower surfaces of the dielectric layer 1102a. The conductive metal layer 1102b has been patterned to form a portion of the conductive traces 1106a and 1106b. The conductive metal layer 1102c has also been patterned in a manner that the conductive metal layer 1102c is electrically connected to the conductive trace 1106b but not to the conductive trace 1106a. The conductive metal layer 1102c may function as a ground plane for supplying the ground potential or a power plane for supplying the source voltage. The dielectric layer 1102a may be formed from fiberglass reinforced BT (bismaleimide-triazine) resin, FR-4 fiberglass reinforced epoxy resin or ceramic material.

The semiconductor chip packages disclosed in the present invention are characterized in that the bonding pads 212 of the semiconductor chip 202 are disposed on the active area 202a and the external contacts 210 may be positioned over the dummy area 202b (see FIG. 5) thereby the semiconductor chip package may be designed to have a "fan-out" layout. However, a person of skill in the art would understand that the external contacts 210 may be positioned over the active area 202a and the dummy area 202b thereby the semiconductor chip package may be designed to have a "fan-in" or other layout. Furthermore, since the dummy area 202b is a portion of the chip 202 and is formed from semiconductor material with good heat dissipation capability, the dummy area may function as a heat sink to help heat dissipation of the chip thereby enhancing the thermal performance of the semiconductor chip package. According to the aforementioned advantages, the semiconductor chip package of the present invention provides a larger distributing surface (the active area 202a and the dummy area 202b) for the external contacts and has a better thermal performance, and, therefore, is a suitable design for high packaging density (high pin count) semiconductor chip packages.

Figure 1:
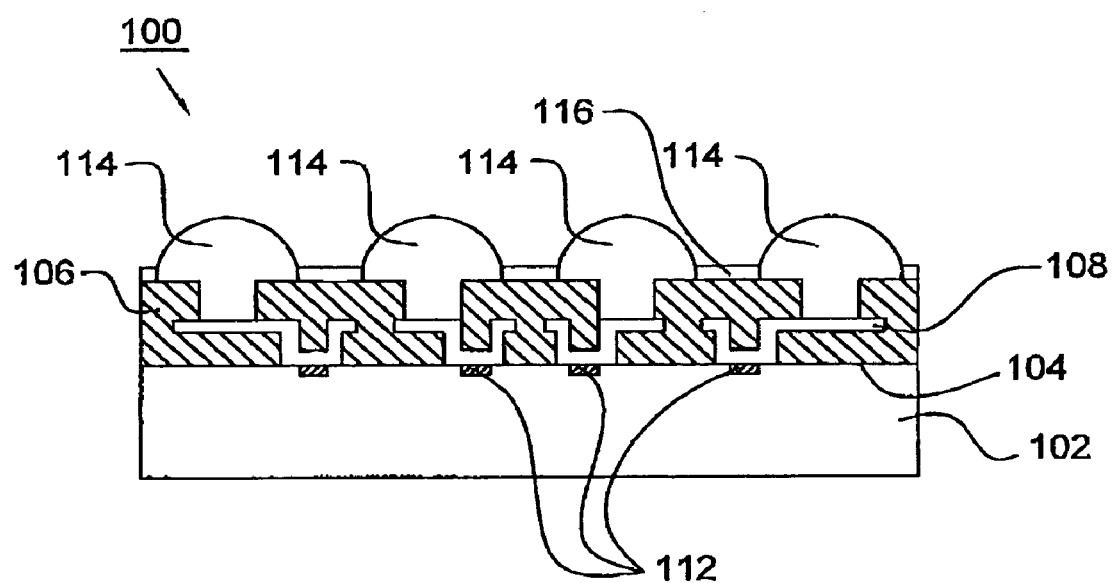
FIG. 1 is a cross-sectional view of a conventional chip scale package.
Figure 2:
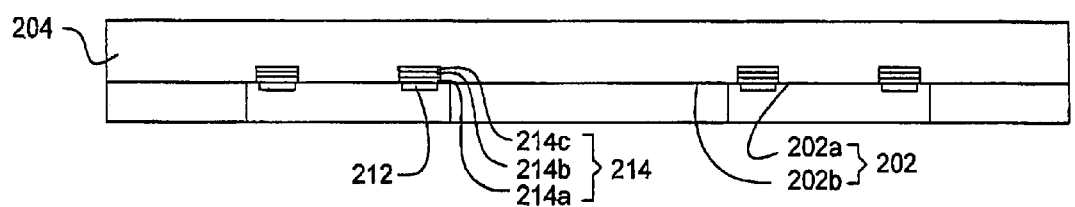
FIGS. 2–5 illustrate in cross-section major steps of fabrication of semiconductor chip packages according to one embodiment of the present invention.

The present invention provides a method for manufacturing the aforementioned semiconductor chip package 200 via build-up process. First, as shown in FIG. 2, a first dielectric layer 204 is formed on an upper surface of a semiconductor wafer comprising a plurality of semiconductor chips 202 each having a plurality of bonding pads 212 disposed on the upper surface of the semiconductor wafer.

Figure 3:
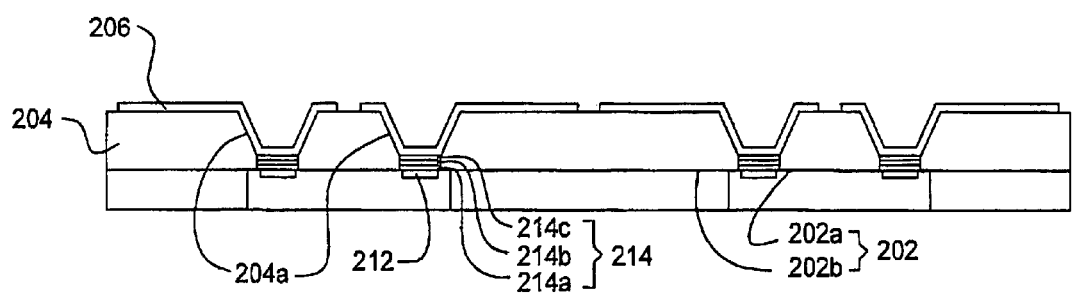

Referring to FIG. 3, a plurality of first openings 204a are formed in the dielectric layer 204 to expose the bonding pads 212 of the semiconductor chips 202 from the dielectric layer 204 by photoreaction or laser. Then, a conductive metal layer is formed on the dielectric layer 204 and the bonding pads 212 exposed in the first openings 204a by plating or depositing (e.g., CVD or PVD). According to one embodiment of the present invention, the conductive metal layer may be formed by the steps of electroless plating a metal seed layer on the dielectric layer 204 and the bonding pads 212 exposed in the first openings 204a, and then thickening the metal seed layer to a predetermined thickness by electroplating. The openings 204a of the dielectric layer 204 preferably have a tapered profile that is advantageous for the process of plating the conductive metal layer on the inside portion of the openings 204a and the bonding pads 212. According to one embodiment of the present invention, the conductive metal layer may fill up the openings 204a. Thereafter, the conductive metal layer is selectively etched to form a plurality of conductive traces 206 on the first dielectric layer 204 and the bonding pads 212 exposed in the openings 204a. The openings 204a may be filled with a resin after the conductive traces 206 are formed.

Figure 4:
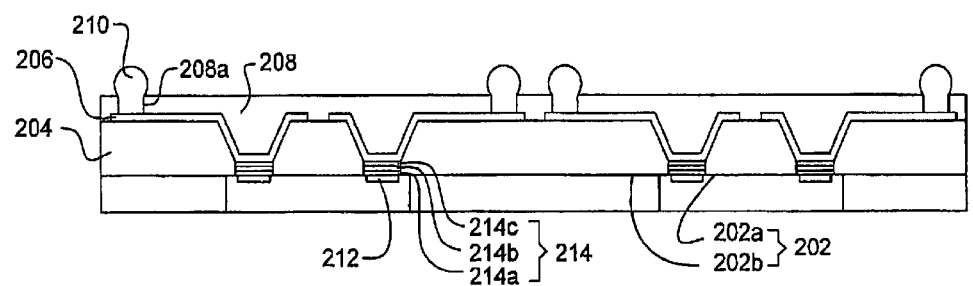

Referring to FIG. 4, a dielectric layer 208 is formed on the dielectric layer 204 and the conductive traces 206. A plurality of openings 208a are formed in the dielectric layer 208 to expose a portion of each of the conductive traces 206 from the dielectric layer 208. The dielectric layer 208 may be a solder mask layer. Thereafter, a plurality of external contacts 210 are formed on the exposed portions of the conductive traces 206.

Referring to FIG. 5, the semiconductor wafer 201 is cut to separate the semiconductor chips 202 from each other thereby obtaining the semiconductor chip packages 200.

Although only one layer of conductive traces between two dielectric layers is formed by the aforementioned method, the build-up process may be utilized to form multilayer conductive traces with each layer sandwiched between two dielectric layers thereby obtaining a high packaging density semiconductor chip package.

Figure 6:
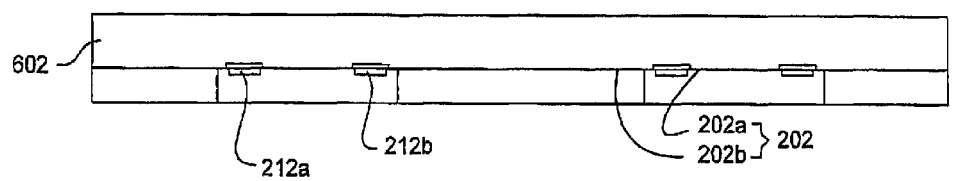
FIGS. 6–10 illustrate in cross-section major steps of fabrication of semiconductor chip packages according to another embodiment of the present invention.

The method according to another embodiment of the present invention comprises the following steps. Referring to FIG. 6, a dielectric layer 602 is formed on an upper surface of a semiconductor wafer 201 comprising a plurality of semiconductor chips 202 each having a plurality of bonding pads 212a (e.g., signal pads) and at least one bonding pad 212b (e.g., a power pad or a ground pad).

Figure 7:
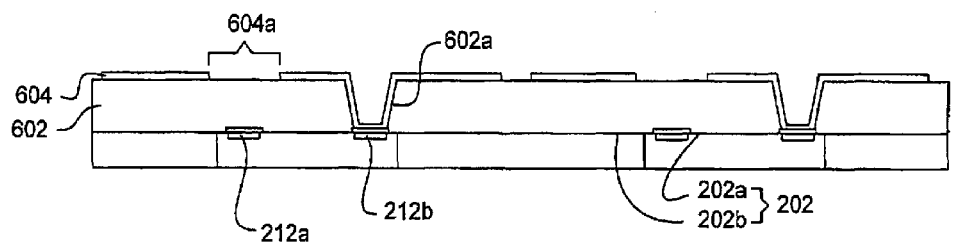

Referring to FIG. 7, an opening 602a is formed in the dielectric layer 602 to expose the bonding pad 212b of each semiconductor chip from the dielectric layer 602. Then, a conductive metal layer 604 is formed on the dielectric layer 602 and the bonding pad 212b exposed in the opening 602a by plating or depositing (e.g., CVD or PVD). Specifically, the conductive metal layer 604 may be formed by the steps of electroless plating a seed layer, and then thickening the seed layer to a predetermined thickness by electroplating. According to one embodiment of the present invention, the conductive metal layer 604 may fill up the openings 602a. Thereafter, the conductive metal layer 604 is selectively etched to form a plurality of openings 604a at locations corresponding to the bonding pads 212a.

Figure 8:
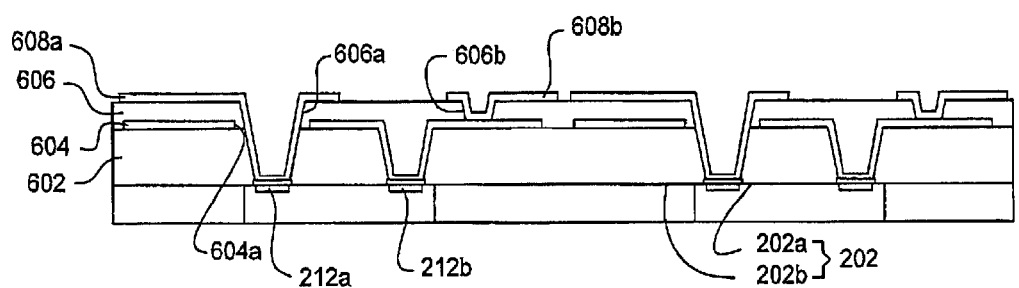

Referring to FIG. 8, a dielectric layer 606 is formed on the conductive metal layer 604 and the openings 604a. According to one embodiment of the present invention, the openings 604a may be filled with a resin before the step of forming the dielectric layer 606. A plurality of third openings 606a are formed in the dielectric layers 602 and 606 to expose the bonding pads 212a of the semiconductor chips 202 from the dielectric layers 602 and 606 wherein the opening 606a is smaller than the opening 604a such that the conductive metal layer 604 is not exposed in the openings 606a. In addition, in the area of each chip, at least one opening 606b is formed in the dielectric layer 606 to expose a portion of the conductive metal layer 604 from the dielectric layer 606. Then, another conductive metal layer is formed on the dielectric layer 606, the bonding pads 212a exposed in the openings 606a and the conductive metal layer 604 exposed in the openings 606b by plating or depositing (e.g., CVD or PVD). According to one embodiment of the present invention, the conductive metal layer may be formed by the steps of electroless plating a seed layer on the dielectric layer 606 and the bonding pads 212a exposed in the openings 606a and the conductive metal layer 604 exposed in the openings 606b, and then thickening the seed layer to a predetermined thickness by electroplating. According to one embodiment of the present invention, the conductive metal layer may fill up the openings 606a and 606b. Thereafter, the conductive metal layer is selectively etched to form a plurality of conductive traces 608a on the dielectric layer 606 and the bonding pads 212a exposed in the openings 606b and a plurality of conductive traces 608b on the dielectric layer 606 and the conductive metal layer 604 exposed in the openings 606b. The conductive traces 608a are electrically connected to the bonding pads 212a but not electrically connected to the conductive metal layer 604, and the conductive traces 608b are electrically connected to the conductive metal layer 604 which, in turn, is electrically connected to the bonding pads 212b. According to one embodiment of the present invention, the openings 606a and 606b may be filled with a resin.

Figure 9:
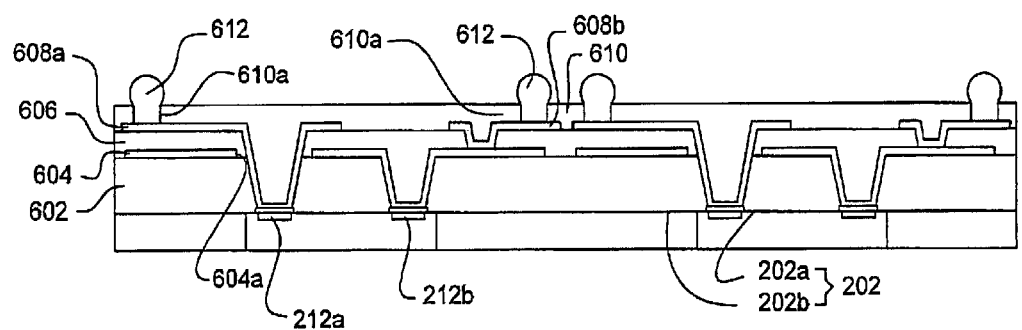

Referring to FIG. 9, a dielectric layer 610 is formed on the dielectric layer 606 and the conductive traces 608a and 608b. A plurality of openings 610a are formed in the dielectric layer 610 to expose a portion of each of the conductive traces 608a and 608b from the dielectric layer 610. A plurality of external contacts 612 are formed on the exposed portions of the conductive traces 608a and 608b.

Referring to FIG. 10, the semiconductor wafer 201 is cut to separate the semiconductor chips 202 from each other thereby obtaining the semiconductor chip packages 600. In this embodiment, the conductive metal layer 604 may function as a ground plane for supplying the ground potential or a power plane for supplying the source voltage.

In the aforementioned methods, the conductive metal layer forming step may comprise the step of thickening the conductive metal layer to a predetermined thickness by electroplating. Therefore, compared to conventional conductive traces which are formed by sputtering or other methods, the conductive traces or conductive metal layer of the present invention provide a better electrical performance because of their larger thickness.

Figure 11:
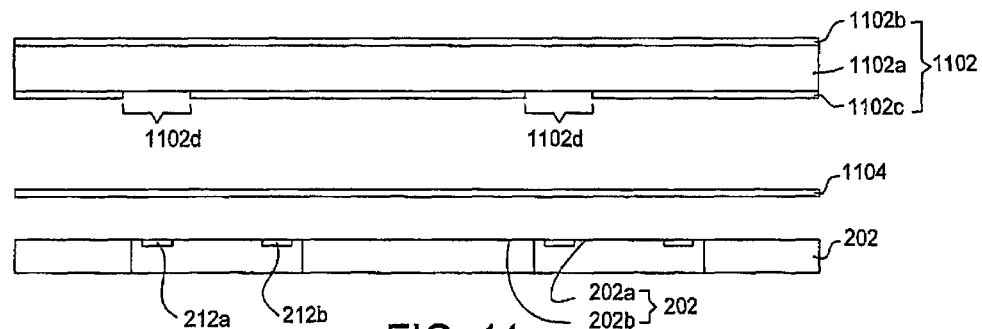
FIGS. 11–15 illustrate in cross-section major steps of fabrication of semiconductor chip packages according to another embodiment of the present invention.

The present invention further provides a method for manufacturing the semiconductor chip packages 1100 via lamination process. Referring to FIG. 11, a substrate 1102 is laminated on an upper surface of a semiconductor wafer via an adhesive layer 1104 wherein the substrate includes a dielectric layer 1102a and two conductive metal layers 1102b and 1102c respectively laminated on upper and lower surfaces of the dielectric layer 1102a. The conductive metal layers 1102b or 1102c may be a copper foil laminated on the surface of the dielectric layer 1102a. Note that the conductive metal layer 1102c is selectively etched to form a plurality of openings 1102d at locations facing the bonding pads 212a in advance. It should be understood that although it may be helpful to have the conductive metal layer 1102c to serve as the ground plane or the power plane of the final product, the conductive metal layer 1102c is not an essential aspect of the present invention.

Figure 12:
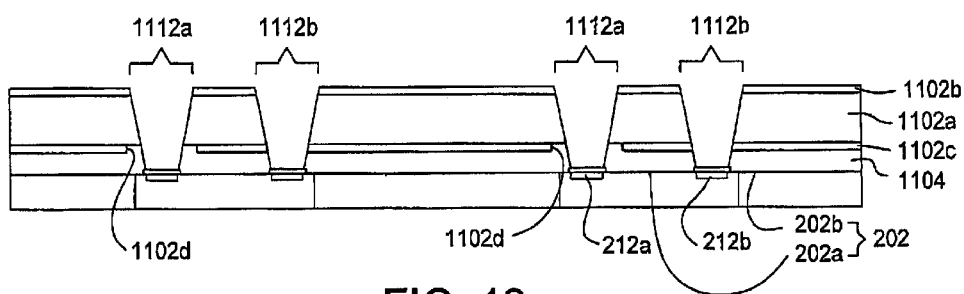

Referring to FIG. 12, a plurality of openings 1112a and 1112b are formed at locations over the bonding pads 212a and 212b of the semiconductor chips to expose the bonding pads 212a and 212b from the substrate 1102 by laser drilling or mechanical drilling. Note that the opening 112a is smaller than the opening 1102d such that the conductive metal layer 1102c is only exposed in the openings 1112b but not exposed in the openings 112a.

Figure 13:
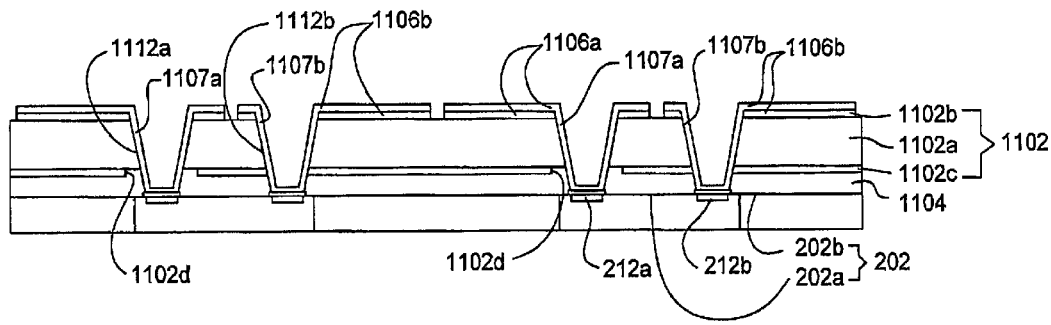

Referring to FIG. 13, a conductive metal layer 1107a is formed in the openings 1112a to electrically interconnect the conductive metal layer 1102b and the bonding pads 212a. In the meanwhile, a conductive metal layer 1107b is formed to electrically interconnect the conductive metal layers 1102a and 1102b and the bonding pads 212b. The conductive metal layers 1107a and 1107b and the conductive metal layer 1102b are selectively etched to form a plurality of conductive traces 1106a and 1106b on the dielectric layer 1102a and the bonding pads 212a and 212b.

Figure 14:
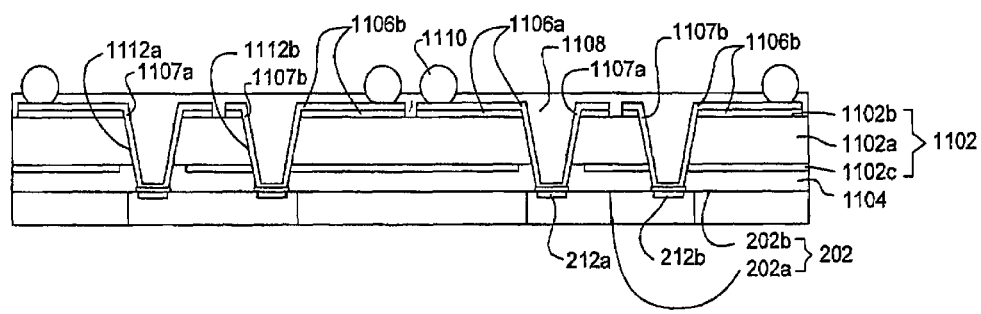

Referring to FIG. 14, a dielectric pattern such as a patterned solder mask 1108 is formed on the dielectric layer 102a and the conductive traces 1106a and 1106b such that a portion of each of the conductive traces 1106a and 1106b is exposed from the patterned solder mask 1108. A plurality of external contacts 1110 are formed on the exposed portions of the conductive traces 1106a and 1106b.

Referring to FIG. 15, the semiconductor wafer 201 is cut to separate the semiconductor chips 202 from each other thereby obtaining the semiconductor chip packages 1100. In this method, the conductive metal layer 1102c may function as a ground plane for supplying the ground potential or a power plane for supplying the source voltage.

In another embodiment of the present invention, a specific kind of substrate may be used. The dielectric layer of this kind of substrate is formed from a preg such as a semi-cured thermosetting resin (B-stage condition) and no conductive layer is provided on the lower surface thereof. Therefore, this kind of substrate may be directly secured to the semiconductor wafer by thermocompression.

Although the aforementioned method utilizes either build-up process or lamination process to form multilayer conductive traces on the semiconductor chip, a person of skill in the art should understood that high packaging density semiconductor chip packages may be obtained by combination of build-up process and lamination process.

The semiconductor chip package manufacturing methods disclosed in the present invention are accomplished by directly forming a substrate structure for making external electrical connection on the surface of a semiconductor wafer via build-up or lamination process whereby a plurality of semiconductor chip packages are manufactured at one time thereby saving save labor hours and increasing throughput. Furthermore, as the cost of wafer is decreased and the size of wafer is increased, the methods of the present invention are suitable in packaging a semiconductor chip having the aforementioned active area and dummy area wherein the bonding pads disposed on the active area are electrically connected to the external contacts positioned over the active area and the dummy area thereby the finished semiconductor chip package have a "fan-out" or "fan-in" layout. Although the methods disclosed in the embodiments of the present invention are illustrated to package a semiconductor chip having the aforementioned active area and dummy area, the aforementioned methods are also applicable for packaging a semiconductor chip having a conventional structure.

Although the invention has been explained in relation to its preferred embodiment, it is to be understood that many other possible modifications and variations can be made without departing from the spirit and scope of the invention as hereinafter claimed.

What is claimed is:

1. A method for manufacturing semiconductor chip packages, the method comprising the steps of:

forming a first dielectric layer on an upper surface of a semiconductor wafer comprising a plurality of semiconductor chips each having a first bonding pad and a plurality of second bonding pads disposed on the upper surface of the semiconductor wafer;

forming a plurality of first openings in the first dielectric layer to expose the first bonding pads of the semiconductor chips from the first dielectric layer;

forming a first conductive metal layer on the first dielectric layer and the first bonding pads by plating or depositing;

selectively etching the first conductive metal layer to form a plurality of second openings at locations corresponding to the second bonding pads;

forming a second dielectric layer on the first conductive metal layer and the second openings;

forming a plurality of third openings in the first dielectric layer and the second dielectric layer to expose the second bonding pads of the semiconductor chips from the first dielectric layer and the second dielectric layer wherein the third openings are smaller than the second openings such that the first conductive metal layer is not exposed in the third openings;

forming a fourth opening in the second dielectric layer to expose a portion of the first conductive metal layer from the second dielectric layer;

forming a second conductive metal layer on the second dielectric layer, the second bonding pads exposed in the third openings and the first conductive metal layer exposed in the fourth opening by plating or depositing;

selectively etching the second conductive metal layer to form a plurality of conductive traces extending on the second dielectric layer and the second bonding pads exposed in the third openings or extending on the second dielectric layer and the first conductive metal layer exposed in the fourth opening;

forming a third dielectric layer on the second dielectric layer and the conductive traces;

forming a plurality of fifth openings in the third dielectric layer to expose a portion of each of the conductive traces from the third dielectric layer;

forming a plurality of external contacts on the exposed portions of the conductive traces; and cutting the semiconductor wafer such that the semiconductor chips are separated from each other thereby obtaining the semiconductor chip packages.

2. The method as claimed in claim 1, further comprising the step of selectively forming an under bump metallurgy on the bonding pads of the semiconductor chip before the step of forming the first dielectric layer on the upper surface of the semiconductor wafer.

3. The method as claimed in claim 1, wherein the first conductive metal layer forming step comprises the steps of electroless plating a first seed layer on the first dielectric layer and the first bonding pads exposed in the first openings, and then thickening the first seed layer to a predetermined thickness by electroplating thereby forming the first conductive metal layer.

4. The method as claimed in claim 1, wherein the second conductive metal layer forming step comprises the steps of electroless plating a second seed layer on the second dielectric layer, the second bonding pads exposed in the third openings and the first conductive metal layer exposed in the fourth opening, and then thickening the second seed layer to a predetermined thickness by electroplating thereby forming the second conductive metal layer.

5. The method as claimed in claim 1, further comprising the step of filling the third openings and the fourth openings with a resin after the conductive traces are formed.

6. A method for manufacturing semiconductor chip packages, the method comprising the steps of:

laminating a substrate on an upper surface of a semiconductor wafer comprising a plurality of semiconductor chips each having a plurality of first bonding pads disposed on the upper surface of the semiconductor wafer, wherein the substrate includes a dielectric layer and a first conductive metal layer laminated on an upper surface of the dielectric layer;

forming a plurality of first openings in the substrate at locations facing the first bonding pads of the semiconductor chips to expose the first bonding pads from the substrate;

electrically connecting the first conductive metal layer and the first bonding pads exposed in the first openings;

selectively etching the first conductive metal layer to form a plurality of first conductive traces electrically connected to the first bonding pads;

forming a patterned solder mask on the dielectric layer and the first conductive traces such that a portion of each of the first conductive traces is exposed from the patterned solder mask;

forming a plurality of external contacts on the exposed portions of the conductive traces; and cutting the semiconductor wafer such that the semiconductor chips are separated from each other thereby obtaining the semiconductor chip packages.

7. The method as claimed in claim 6, wherein the substrate is securely attached to the semiconductor wafer via an adhesive layer, and the first openings are formed through the adhesive layer during the first openings forming step.

8. The method as claimed in claim 7, wherein the substrate further comprises a second conductive metal layer laminated on an lower surface of the dielectric layer and each of the semiconductor chips further comprises a second bonding pad, the method further comprises the steps of:

forming a plurality of second openings in the second conductive metal layer at locations corresponding to the first bonding pads before the step of laminating the substrate on the semiconductor wafer, wherein the second opening is larger than the first opening;

forming a third opening positioned over the second bonding pad such that the second bonding pad and a portion of the second conductive metal layer are exposed in the third opening during the first openings forming step;

electrically connecting the second bonding pads, the first conductive metal layer and the second conductive metal layer during the step of electrically connecting the first conductive metal layer and the first bonding pads exposed in the first openings;

forming a second conductive trace electrically connected to the second bonding pads during the step of selectively etching the first conductive metal layer; and exposing a portion of the second conductive trace from the patterned solder mask during the patterned solder mask forming step.

9. The method as claimed in claim 8, wherein the step of electrically connecting the second bonding pads, the second conductive metal layer and the first conductive metal layer is performed by forming a third conductive metal layer in the third opening by electroless plating.

10. The method as claimed in claim 8, wherein the step of electrically connecting the first conductive metal layer and the first bonding pads exposed in the first openings is performed by forming a fourth conductive metal layer in the first openings by electroless plating.

* * * * *